(12) United States Patent
Yu et al.

(10) Patent No.: US 10,777,745 B2
(45) Date of Patent: Sep. 15, 2020

(54) SWITCHING ELEMENT, VARIABLE RESISTANCE MEMORY DEVICE, AND METHOD OF MANUFACTURING THE SWITCHING ELEMENT

(71) Applicant: SAMSUNG ELECTRONICS CO., LTD., Suwon-si, Gyeonggi-Do (KR)

(72) Inventors: Seung-Geun Yu, Hwaseong-si (KR); Zhu Wu, Seoul (KR); Ja Bin Lee, Hwaseong-si (KR); Jung Moo Lee, Seoul (KR); Jinwoo Lee, Seoul (KR); Kyubong Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/364,232

(22) Filed: Mar. 26, 2019

(65) Prior Publication Data

US 2020/0075853 A1 Mar. 5, 2020

(30) Foreign Application Priority Data

Sep. 4, 2018 (KR) .................. 10-2018-0105378

(51) Int. Cl.
*H01L 45/00* (2006.01)
*H01L 27/24* (2006.01)

(52) U.S. Cl.
CPC ...... *H01L 45/1253* (2013.01); *H01L 27/2463* (2013.01); *H01L 45/1608* (2013.01); *H01L 45/1666* (2013.01)

(58) Field of Classification Search
CPC ... H01L 45/06; H01L 45/065; H01L 45/1233; H01L 45/126; H01L 27/2463; H01L 27/2427; H01L 27/2481; G11C 2213/31; G11C 2213/32; G11C 2213/35; G11C 2213/51
See application file for complete search history.

(56) References Cited

U.S. PATENT DOCUMENTS

| | | | | |
|---|---|---|---|---|
| 5,177,567 | A * | 1/1993 | Klersy | ............... H01L 13/0004 257/2 |
| 5,825,046 | A * | 10/1998 | Czubatyj | ............ G11C 13/0004 257/2 |
| 8,598,010 | B2 | 12/2013 | Joo et al. | |
| 8,841,634 | B2 | 9/2014 | Statham et al. | |
| 8,916,973 | B1 * | 12/2014 | Kim | ...................... H01L 23/345 257/750 |
| 9,543,515 | B2 | 1/2017 | Gealy et al. | |

(Continued)

FOREIGN PATENT DOCUMENTS

| KR | 101064219 B1 | 9/2011 |
|---|---|---|
| KR | 1020160061746 A | 6/2016 |

(Continued)

*Primary Examiner* — Scott B Geyer
(74) *Attorney, Agent, or Firm* — Volentine, Whitt & Francos, PLLC

(57) ABSTRACT

A switching element includes a lower barrier electrode on a substrate, a switching pattern on the lower barrier electrode, and an upper barrier electrode on the switching pattern. The lower barrier electrode includes a first lower barrier electrode layer, and a second lower barrier electrode layer interposed between the first lower barrier electrode layer and the switching pattern and whose density is different from the density of the first lower barrier electrode.

19 Claims, 18 Drawing Sheets

(56) References Cited

U.S. PATENT DOCUMENTS

| | | | |
|---|---|---|---|
| 9,722,172 B2 | 8/2017 | Park et al. | |
| 2007/0108430 A1* | 5/2007 | Lung | H01L 45/143 |
| | | | 257/4 |
| 2008/0247226 A1* | 10/2008 | Liu | H01L 27/2409 |
| | | | 365/163 |
| 2009/0303780 A1* | 12/2009 | Kasko | G11C 13/0004 |
| | | | 365/163 |
| 2010/0084625 A1* | 4/2010 | Wicker | H01L 45/04 |
| | | | 257/4 |
| 2011/0147695 A1* | 6/2011 | Lee | H01L 27/2427 |
| | | | 257/4 |
| 2014/0117302 A1* | 5/2014 | Goswami | H01L 45/06 |
| 2017/0271581 A1 | 9/2017 | Seong et al. | |
| 2019/0044060 A1* | 2/2019 | Russell | H01L 45/145 |
| 2019/0172502 A1* | 6/2019 | Jeong | H01L 27/224 |
| 2019/0259946 A1* | 8/2019 | Makala | H01L 27/2427 |

FOREIGN PATENT DOCUMENTS

| | | |
|---|---|---|
| KR | 101709323 B1 | 2/2017 |
| KR | 1020170108599 A | 9/2017 |
| KR | 1020170112608 A | 10/2017 |
| KR | 101835709 B1 | 3/2018 |
| KR | 101854023 B1 | 5/2018 |

\* cited by examiner

SWITCHING ELEMENT, VARIABLE
RESISTANCE MEMORY DEVICE, AND
METHOD OF MANUFACTURING THE
SWITCHING ELEMENT

PRIORITY STATEMENT

This U.S. non-provisional patent application claims priority under 35 U.S.C. § 119 to Korean Patent Application No. 10-2018-0105378, filed on Sep. 4, 2018, in the Korean Intellectual Property Office, the disclosure of which is hereby incorporated by reference in its entirety.

BACKGROUND

The inventive concepts relate to a semiconductor device. More particularly, a variable resistance memory device, to a switching element of a variable resistance memory device, and to a method of manufacturing the switching element.

Generally, semiconductor memory devices may be classified as volatile memory devices and non-volatile memory devices. Volatile memory devices lose their stored data when their power supplies are interrupted. Volatile memory devices include dynamic random access memory (DRAM) devices and static random access memory (SRAM) devices. On the contrary, non-volatile memory devices retain their stored data even when their power supplies are interrupted. Non-volatile memory devices include programmable ROMs (PROMs), erasable PROMs (EPROMs), electrically EPROMs (EEPROMs), and flash memory devices.

In addition, next-generation semiconductor memory devices (e.g., ferroelectric random access memory (FRAM) devices, magnetic random access memory (MRAM) devices, and phase-change random access memory (PRAM) devices) have been developed to provide high-performance and low power consumption semiconductor memory devices. Materials of these next-generation semiconductor memory devices have resistance values that vary according to currents or voltages applied thereto and retain their resistance values even when currents or voltages are interrupted.

SUMMARY

According to an aspect of the inventive concepts, there is provided a switching element including a lower barrier electrode on a substrate, a switching pattern on the lower barrier electrode, and an upper barrier electrode on the switching pattern. The lower barrier electrode comprises a first lower barrier electrode layer and a second lower barrier electrode layer interposed between the first lower barrier electrode layer and the switching pattern. The density of the second lower barrier electrode layer is different from the density of the first lower barrier electrode layer.

According to an aspect of the inventive concepts, there is also provided a variable resistance memory device including a first conductive line extending longitudinally in a first direction, a second conductive line extending longitudinally in a second direction intersecting the first direction when the first conductive line and the second conductive line are viewed in a plan view, a variable resistance structure interposed between the first and second conductive lines, and a switching element interposed between the variable resistance structure and the second conductive line. The switching element comprises a lower barrier electrode, a switching pattern on the lower barrier electrode, and an upper barrier electrode on the switching pattern. The lower barrier electrode comprises a first lower barrier electrode layer and a second lower barrier electrode layer interposed between the first lower barrier electrode layer and the switching pattern. The density of the second lower barrier electrode layer is different from the density of the first lower barrier electrode layer.

According to an aspect of the inventive concept, there is also provided a variable resistance memory device including a first conductive line, a second conductive line, and a memory cell interposed between and electrically connected to the first and second conductive lines. The memory cell includes a variable resistor whose resistivity is temperature dependent and a switch interposed between the variable resistor and the second conductive line. The switch comprises a switching pattern that selectively electrically conductively connects the variable resistor to the second conductive line, a first lower layer of barrier material interposed between the variable resistor and the switching pattern, and a second lower layer of barrier material interposed between the first lower layer of barrier material and the switching pattern. The density of the barrier material of the second lower layer is different from the density of the barrier material of the first lower layer.

According to another aspect of the inventive concept, there is provided a method of manufacturing a switching element, which includes forming a lower barrier layer on a substrate, forming a switching layer on the lower barrier layer, forming an upper barrier layer on the switching layer, and removing portions of the lower barrier layer, the switching layer and the upper barrier layer to form a switching element. The forming of the lower barrier layer may include forming a first lower barrier layer, and forming a second lower barrier layer on the first lower barrier layer, wherein the density of the second lower barrier is different from the density of the first lower barrier layer.

BRIEF DESCRIPTION OF THE DRAWINGS

The inventive concepts will become more apparent in view of the attached drawings and accompanying detailed description.

DETAILED DESCRIPTION

Figure 1:
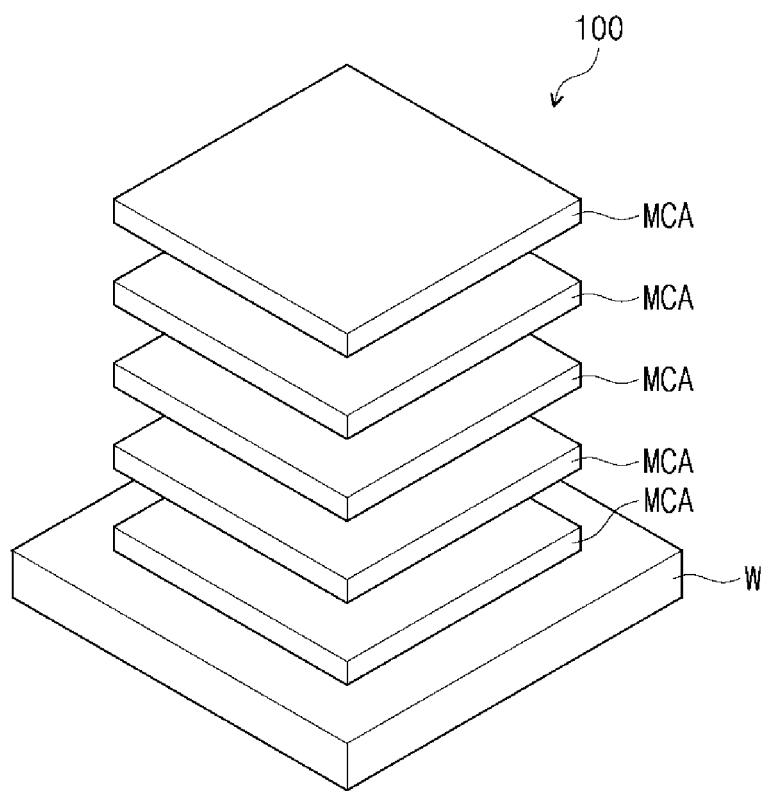
FIG. 1 is a perspective view of an example of a variable resistance memory device according the inventive concepts.

Referring to FIG. 1, a variable resistance memory device 100 according to the inventive concepts may include a plurality of memory cell arrays MCA sequentially stacked on a substrate W. Each of the memory cell arrays MCA may include a two-dimensional array of variable resistance memory cells. The variable resistance memory device 100 may further include conductive lines (not shown) which are disposed between the memory cell arrays and are used to write data to, read data from and/or erase the variable resistance memory cells. FIG. 1 illustrates a stack of five memory cell arrays MCA. However, the inventive concepts are not limited thereto.

Figure 2:
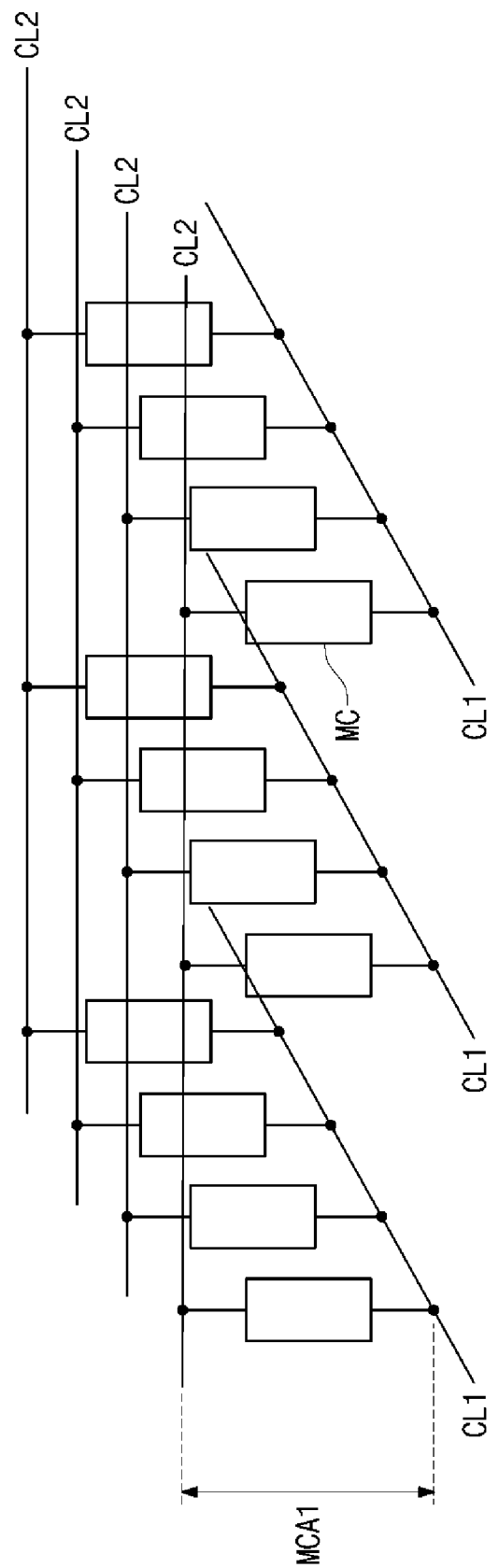
FIG. 2 is a circuit diagram of a memory cell stack of the variable resistance memory device of FIG. 1.

FIG. 2 is a circuit diagram of one of the memory cell arrays of FIG. 1. A first memory cell array MCA1 is illustrated as an example in FIG. 2. The first memory cell array MCA1 may include memory cells MC disposed at intersecting points, as viewed in plan, of first conductive lines CL1 and second conductive lines CL2. Although not shown in FIG. 2, a second memory cell array may be provided on the first memory cell array MCA1. Like the first memory cell array MCA1, the second memory cell array may include memory cells provided at intersecting points of third conductive lines and fourth conductive lines. For example, the third conductive lines are separate conductive lines vertically spaced apart from the second conductive lines CL2. Alternatively, the second memory cell array may share the second conductive lines CL2 with the first memory cell array MCA1. In this case, the third conductive lines correspond to the second conductive lines CL2. The memory cells MC of the first memory cell array MCA1 may be two-dimensionally arrayed on the substrate W to constitute rows and columns.

Figure 3:
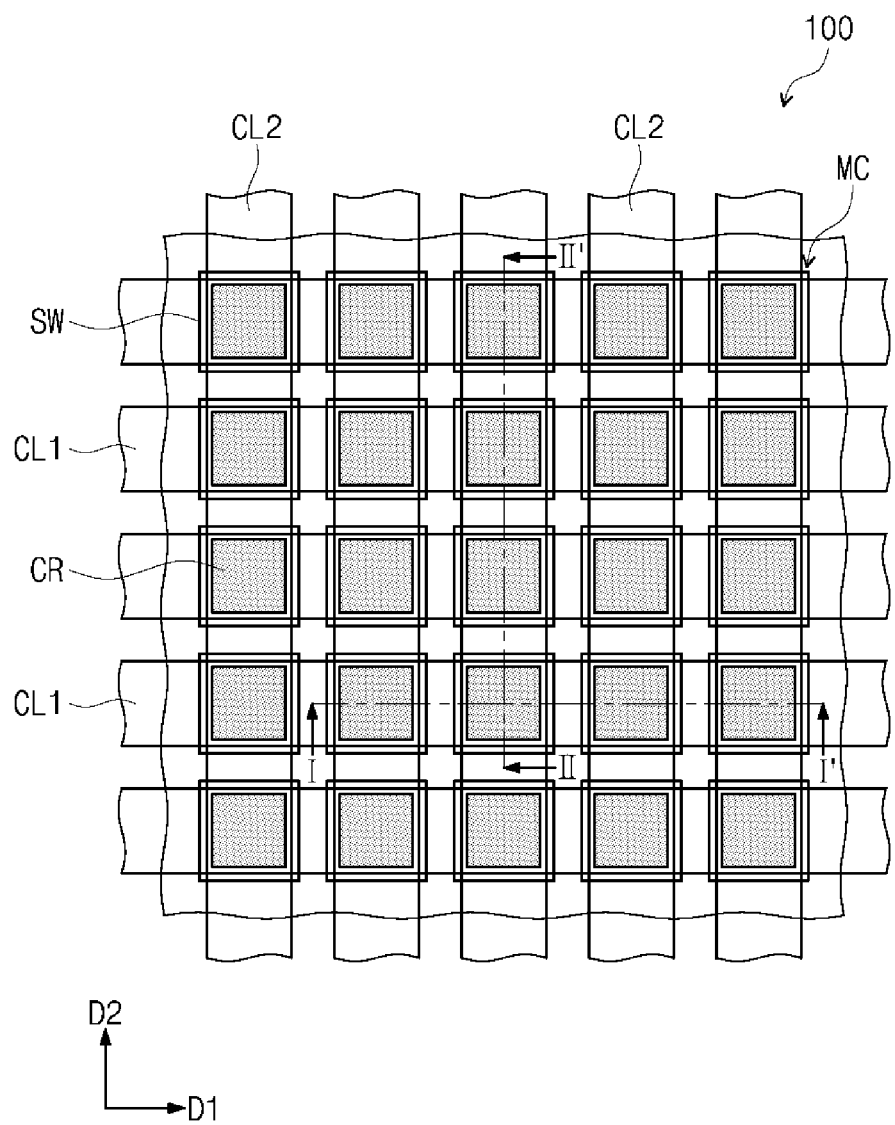
FIG. 3 is a plan view of examples of a variable resistance memory device according to the inventive concepts.
Figure 4:
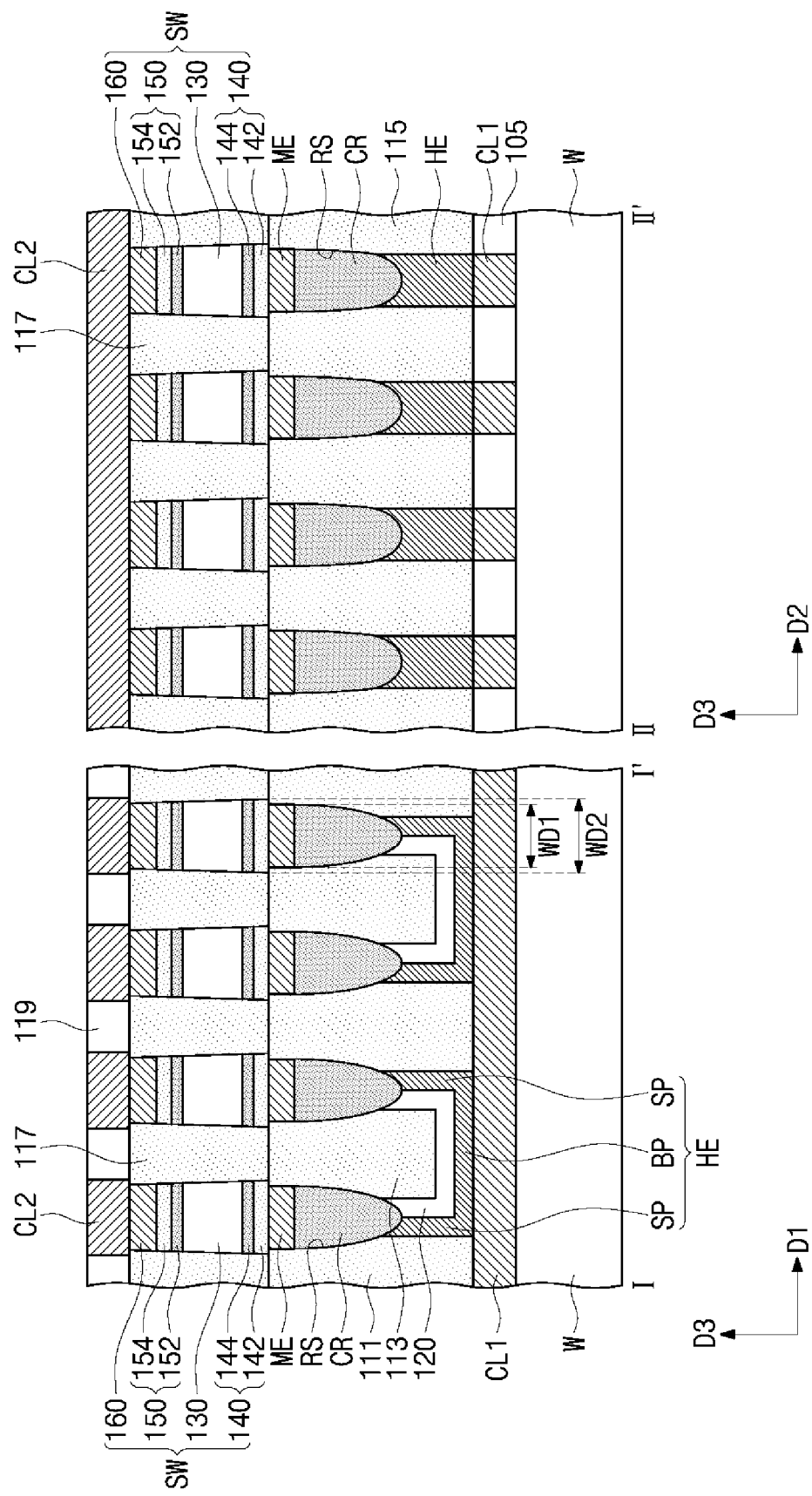
FIG. 4 is a cross-sectional view of one example of a variable resistance memory device according to the inventive concepts taken along lines I-I' and II-II' of FIG. 3.

FIG. 3 is a plan view of the first and second conductive lines CL1 and CL2 and the memory cells MC represented in the circuit diagram of FIG. 2. FIG. 4 is a cross-sectional view taken along lines I-I' and II-II' of FIG. 3. FIGS. 2, 3 and 4 may together illustrate an example of a variable resistance memory device according to the inventive concepts.

Referring to FIGS. 3 and 4, the first conductive lines CL1 may extend in a first direction D1 on the substrate W, and the second conductive lines CL2 may extend in a second direction D2 on the substrate W. The substrate W may include a single-crystalline semiconductor material. For example, the substrate W may be a silicon substrate, a silicon-on-insulator (SOI) substrate, a germanium substrate, a germanium-on-insulator (GOI) substrate or a silicon-germanium (SiGe) substrate. The first conductive lines CL1 may be word lines, and the second conductive lines CL2 may be bit lines. Alternatively, the first conductive lines CL1 may be bit lines, and the second conductive lines CL2 may be word lines. The first and second conductive lines CL1 and CL2 include a conductive material such as copper or aluminum. The first and second conductive lines CL1 and CL2 may further include a conductive metal nitride such as TiN or WN. The first conductive lines CL1 may be provided in a lower insulating layer 105. The second conductive lines CL2 may be provided in an upper insulating layer 119. The lower insulating layer 105 and the upper insulating layer 119 may each be a silicon oxide or silicon oxynitride layer.

The memory cells MC are interposed between the first conductive lines CL1 and the second conductive lines CL2. In examples of the present inventive concepts, each of the memory cells MC includes a variable resistor and a switch, respectively referred to hereinafter as variable resistance structure CR and a switching element SW. The variable resistance structure CR may be connected to the first conductive line CL1. The variable resistance structure CR has a resistance value which is variable to store logic data. The switching element SW may be connected to the second conductive line CL2. The switching element SW may connect the second conductive line CL2 to the variable resistance structure CR when a voltage higher than a threshold voltage ($V_{th}$) of the switching element SW is impressed across the switching element, i.e., the switching element SW selectively electrically conductively connects the variable resistance structure CR to the second conductive line CL2. The memory cell MC may further include an intermediate electrode ME between the variable resistance structure CR and the switching element SW. The variable resistance structure CR may be provided between the switching element SW and the substrate W. Alternatively, the switching element SW is provided between the variable resistance structure CR and the substrate W. Hereinafter, an example in which the variable resistance structure CR is provided between the first conductive line CL1 and the switching element SW will be described for the purpose of ease and convenience of explanation although the inventive concepts are not limited thereto.

The variable resistance structure CR may be provided in a recess RS formed in first to third interlayer insulating layers 111, 113 and 115 on the first conductive line CL1. The first to third interlayer insulating layers 111, 113 and 115 may each be a silicon nitride or silicon oxynitride layer. A plurality of the recesses RS may be respectively disposed at intersecting points of the first conductive lines CL1 and the second conductive lines CL2 and may be two-dimensionally arranged, when viewed in a plan view. Alternatively, the variable resistance structure CR may have a line shape extending in the first direction D1 or the second direction D2.

The variable resistance structure CR may be formed of at least one material capable of storing logical data. When the variable resistance memory device 100 is a phase change memory device, the variable resistance structure CR includes a material having a phase transition temperature across which its phase changes between a crystalline phase and an amorphous phase.

For example, a phase transition temperature between the crystalline and amorphous phases of the variable resistance structure CR may range from about 250 degrees Celsius to about 350 degrees Celsius. The variable resistance structure CR may be formed of a compound that includes at least one of Te and Se (i.e., chalcogenide elements) and at least one material selected from the group consisting of Ge, Sb, Bi, Pb, Sn, Ag, As, S, Si, In, Ti, Ga, P, O, and C. For example, the variable resistance structure CR may include a layer (pattern) of GeSbTe, GeTeAs, SbTeSe, GeTe, SbTe, SeTeSn, GeTeSe, SbSeBi, GeBiTe, GeTeTi, InSe, GaTeSe or InSbTe. In certain examples, the variable resistance structure CR may have a superlattice structure in which layers including Ge and layers not including Ge are repeatedly and alternately stacked. For example, the variable resistance structure CR may have a structure in which GeTe layers and SbTe layers are repeatedly and alternately stacked.

In certain examples, the variable resistance structure CR includes at least one material selected from the group of perovskite compounds and the group of conductive metal oxides. For example, the variable resistance structure CR may include a layer (pattern) of niobium oxide, titanium oxide, nickel oxide, zirconium oxide, vanadium oxide, (Pr, Ca)MnO$_3$ (PCMO), strontium-titanium oxide, barium-strontium-titanium oxide, strontium-zirconium oxide, barium-zirconium oxide, or barium-strontium-zirconium oxide. When the variable resistance structure CR includes a transition metal oxide, a dielectric constant of the variable resistance structure CR is greater than a dielectric constant of silicon oxide. In certain examples, the variable resistance structure CR has a double-layer structure of a conductive metal oxide layer and a tunnel insulating layer. In certain other examples, the variable resistance structure CR has a triple-layer structure of a first conductive metal oxide layer, a tunnel insulating layer and a second conductive metal oxide layer. The tunnel insulating layer may include aluminum oxide, hafnium oxide, or silicon oxide.

A heater electrode HE may be provided between the first conductive line CL1 and the variable resistance structure CR. The heater electrode HE may connect respective ones of the variable resistance structures CR, adjacent to each other in the first direction D1, to the first conductive line CL1. For example, the heater electrode HE may include a horizontal portion BP connected to the first conductive line CL1, and a pair of vertical portions SP extending from ends of the horizontal portion BP to the variable resistance structures CR, respectively. Alternatively, a plurality of the heater electrodes HE may be respectively disposed at the intersecting points of the first conductive lines CL1 and the second conductive lines CL2 and may be two-dimensionally arranged. The heater electrode HE serves to heat the variable resistance structure CR to change the phase of the variable resistance structure CR. The heater electrode HE may be formed of a material whose resistivity is greater than that of the first conductive line CL1. For example, the heater electrode HE may include at least one layer (pattern) of material selected from the group consisting of W, Ti, Al, Cu, C, CN, TiN, TiAlN, TiSiN, TiCN, WN, CoSiN, WSiN, TaN, TaCN, TaSiN, or TiO.

A spacer pattern 120 may be provided between the heater electrode HE and the second interlayer insulating layer 113. The spacer pattern 120 may extend along the horizontal portion BP and the vertical portions SP of the heater electrode HE. The spacer pattern 120 may be formed of silicon oxide and/or silicon oxynitride.

A lower portion of the recess RS may be occupied by the variable resistance structure CR, and an upper portion of the recess RS may be occupied by the intermediate electrode ME. The intermediate electrode ME electrically connects the variable resistance structure CR and the switching element SW and prevents the variable resistance structure CR from being in direct contact with the switching element SW. The intermediate electrode ME may include at least one layer (pattern) of material selected from the group consisting of W, Ti, Al, Cu, C, CN, TiN, TiAlN, TiSiN, TiCN, WN, CoSiN, WSiN, TaN, TaCN, and TaSiN. Top surfaces of the first to third interlayer insulating layers 111, 113 and 115 may be substantially coplanar with a top surface of the intermediate electrode ME. Alternatively, the intermediate electrode ME may be provided on the first to third interlayer insulating layers 111, 113 and 115.

The switching element SW may be disposed on the intermediate electrode ME. In some examples, the switching element SW includes an ovonic threshold switch (OTS) element having a bi-directional characteristic. The switching element SW may include an element based on a threshold switching phenomenon having a nonlinear I-V curve (e.g., a S-shaped I-V curve). In some examples, the switching element SW includes a switching pattern 130, a lower barrier electrode 140, an upper barrier electrode 150, and an upper electrode 160.

The switching pattern 130 may be disposed on the lower barrier electrode 140. The switching pattern 130 may have a phase transition temperature between crystalline and amorphous phases, which is higher than that of the variable resistance structure CR. For example, the phase transition temperature of the switching pattern 130 may range from about 350 degrees Celsius to about 450 degrees Celsius. Thus, when an example of the variable resistance memory device 100 according to the inventive concepts is operated, the phase of the variable resistance structure CR may be reversibly changed between the crystalline and amorphous phases by an operating voltage (e.g., a program voltage), but a substantially amorphous state of the switching pattern 130 may be maintained without phase change even though the operating voltage is applied thereto. In the present specification, the term 'substantially amorphous state' refers to a completely amorphous state but also a case in which a grain boundary or a crystallized portion locally exists in a portion of the material being described. The switching pattern 130 may be formed of a compound that includes at least one of Te and Se (i.e., at least one chalcogenide element) and at least one material selected from the group consisting of Ge, Sb, Bi, Al, Pb, Sn, Ag, As, S, Si, In, Ti, Ga, and P. The switching pattern 130 may further include a thermal stabilization element in addition to the compound. The thermal stabilization element may include at least one of C, N, and O. For example, the switching pattern 130 may include a layer (pattern) of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe.

The lower barrier electrode 140 may be disposed between the intermediate electrode ME and the switching pattern 130. The lower barrier electrode 140 may prevent or minimize heat transfer between the intermediate electrode ME and the switching pattern 130. The lower barrier electrode 140 is a multi-layered structure of electrode layers distinguished from each by a difference in their respective densities, and may also have different resistivities and/or surface roughnesses. In some examples, the lower barrier electrode 140 includes a first layer of barrier material and a second layer of barrier material respectively referred to hereinafter as a first lower barrier electrode 142 (or first lower barrier electrode layer) and a second lower barrier electrode 144 (or second lower barrier electrode layer). The term "layer" especially when specifically used will be generally understood as referring to a monolayer, i.e., a generally homogeneous layer of material.

The first lower barrier electrode 142 may be disposed between the intermediate electrode ME and the switching pattern 130. The first lower barrier electrode 142 may reduce stress between the intermediate electrode ME and the switching pattern 130 and may increase adhesive strength therebetween. In some examples, the first lower barrier electrode 142 is wider than the intermediate electrode ME in the first direction D1 or the second direction D2. The intermediate electrode ME may have a first width WD1, and the first lower barrier electrode 142 may have a second width WD2 greater than the first width WD1. Thus, the first lower barrier electrode 142 may also be disposed between the switching pattern 130 and a portion of the first to third interlayer insulating layers 111, 113 and 115. The first lower barrier electrode 142 may reduce stress between the switching pattern 130 and the portion of the first to third interlayer insulating layers 111, 113 and 115 and may increase adhesive strength therebetween. For example, the first lower barrier electrode 142 is or includes low-density carbon film having a density less than about 2.0 g/cm³, e.g., a density of about 1.73 g/cm³. The first lower barrier electrode 142 may have a resistivity of about 46.5 mΩ·cm and a surface roughness of about 1.0 nm.

The second lower barrier electrode 144 may be disposed between the first lower barrier electrode 142 and the switching pattern 130. The density of the second lower barrier electrode 144 may be higher than the density of the first lower barrier electrode 142. For example, the second lower barrier electrode 144 may include high-density carbon film having a density greater than about 2.0 g/cm³, e.g. a density of about 2.34 g/cm³. Here, the term "about" encompasses not only the specification for the density of the material but slight variations therefrom arising from inherent aspects of the process used to form the material to its specifications.

The second lower barrier electrode 144 may minimize or prevent diffusion of elements included in the switching pattern 130. In addition, the second lower barrier electrode 144 may minimize or prevent intermixing of the first lower barrier electrode 142 and the switching pattern 130. A resistivity of the second lower barrier electrode 144 may be less than the resistivity of the first lower barrier electrode 142. A surface roughness of the second lower barrier electrode 144 may be less than the surface roughness of the first lower barrier electrode 142. For example, the second lower barrier electrode 144 may have a resistivity of about 24.8 mΩ·cm and a surface roughness of about 0.4 nm.

The upper barrier electrode 150 may be disposed on the switching pattern 130. The upper barrier electrode 150 may minimize or prevent heat transfer between the switching pattern 130 and the second conductive line CL2. The upper barrier electrode 150 may be a multi-layered structure including electrode layers distinguished from each other by differences in their respective densities, and may also be distinguished from each other by differences in their resistivities and/or surface roughnesses. In some examples, the upper barrier electrode 150 includes a first upper barrier electrode 152 and a second upper barrier electrode 154.

The first upper barrier electrode 152 may be disposed between the switching pattern 130 and the second upper barrier electrode 154. The first upper barrier electrode 152 may have a density of about 2.34 g/cm³. Thus, the first upper barrier electrode 152 may be a high-density carbon film. The first upper barrier electrode 152 may minimize or prevent diffusion of the elements included in the switching pattern 130. The first upper barrier electrode 152 may minimize or prevent intermixing of the switching pattern 130 and the second upper barrier electrode 154. For example, the first upper barrier electrode 152 may have a resistivity of about 24.8 mΩ·cm and a surface roughness of about 0.4 nm.

The second upper barrier electrode 154 may be disposed between the first upper barrier electrode 152 and the upper electrode 160. The density of the second upper barrier electrode 154 may be less than the density of the first upper barrier electrode 152. For example, the second upper barrier electrode 154 may have a density of about 1.73 g/cm³. Thus, the second upper barrier electrode 154 may be a low-density carbon film. The second upper barrier electrode 154 may reduce stress between the first upper barrier electrode 152 and the upper electrode 160 and may increase adhesive strength therebetween. The second upper barrier electrode 154 may have a resistivity of about 46.5 mΩ·cm and a surface roughness of about 1.0 nm.

The upper electrode 160 may be disposed on the second upper barrier electrode 154. The upper electrode 160 may electrically connect the second conductive line CL2 to the switching pattern 130. The upper electrode 160 may include at least one of W, Ti, Al, Cu, C, CN, TiN, TiAlN, TiSiN, TiCN, WN, CoSiN, WSiN, TaN, TaCN, TaSiN, and TiO.

A fourth interlayer insulating layer 117 may fill the space between the upper electrodes 160. The fourth interlayer insulating layer 117 may be disposed between the upper insulating layer 119 and the first to third interlayer insulating layers 111, 113 and 115. A top surface of the fourth interlayer insulating layer 117 may be substantially coplanar with a top surface of the upper electrode 160. The fourth interlayer insulating layer 117 may include at least one of silicon oxide, silicon nitride, silicon oxynitride, silicon oxycarbide, silicon oxycarbonitride, and silicon carbonitride. The upper insulating layer 119 and the second conductive line CL2 may be provided on the fourth interlayer insulating layer 117.

Figure 5:
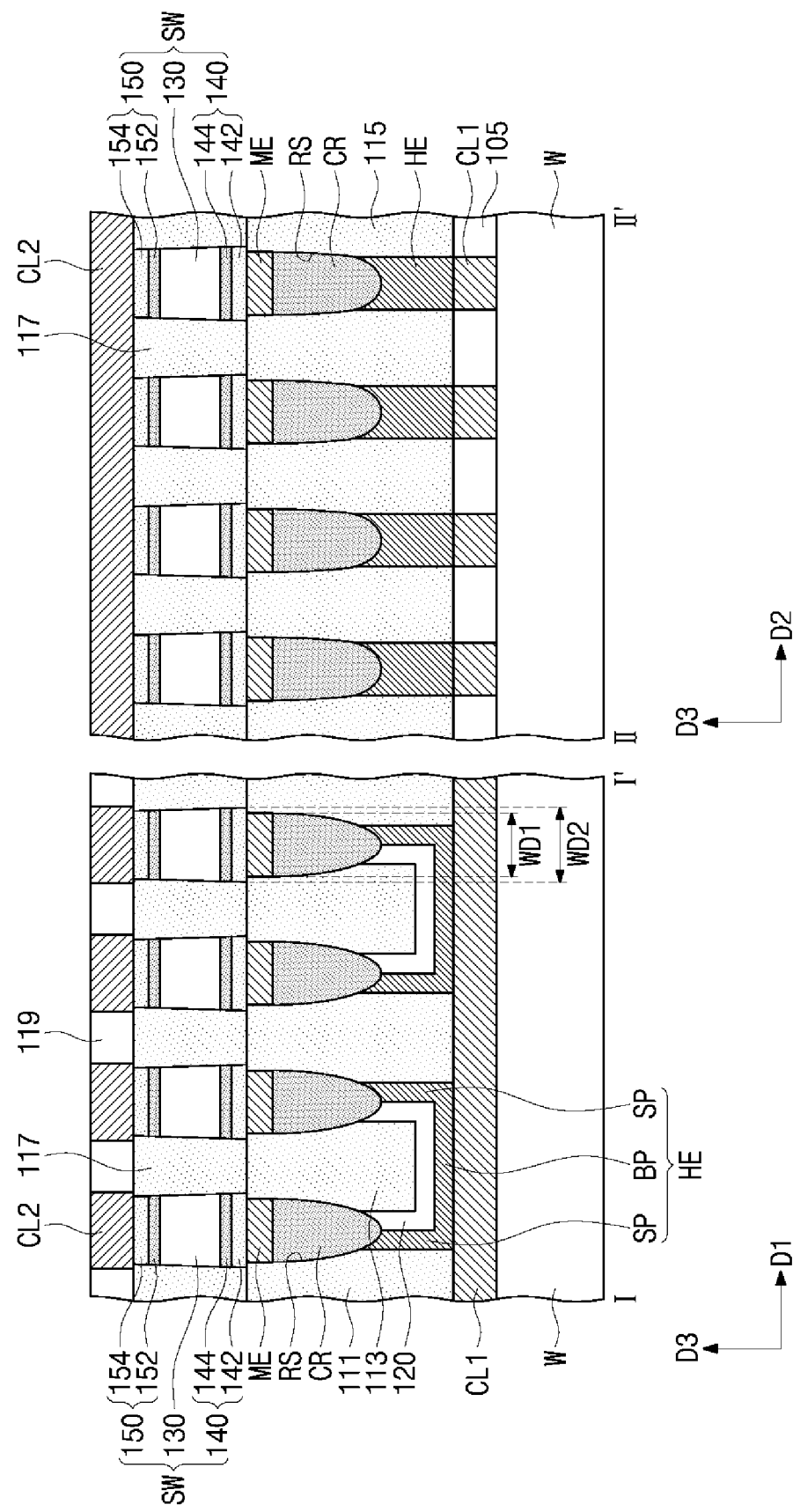
FIG. 5 is a cross-sectional view of another example of a variable resistance memory device according to the inventive concepts taken along the lines I-I' and II-II' of FIG. 3.

FIG. 5 is a cross-sectional view taken along lines I-I' and II-II' of FIG. 3 and together with FIG. 2 illustrate another example of a variable resistance memory device according to the inventive concepts. Hereinafter, for the sake of brevity components which are the same as those in the above examples, as designated by like reference numerals, will not be described again in detail.

In the example illustrated in FIG. 5, there is no upper electrode. The density of the second upper barrier electrode layer 154 may be higher than the density of the first upper barrier electrode layer 152. A surface roughness of the second upper barrier electrode layer 154 may be less than a surface roughness of the first upper barrier electrode layer 152. The first upper barrier electrode layer 152 may be a layer of low-density carbon, and the second upper barrier electrode 154 may be a layer of high-density carbon.

Figure 6:
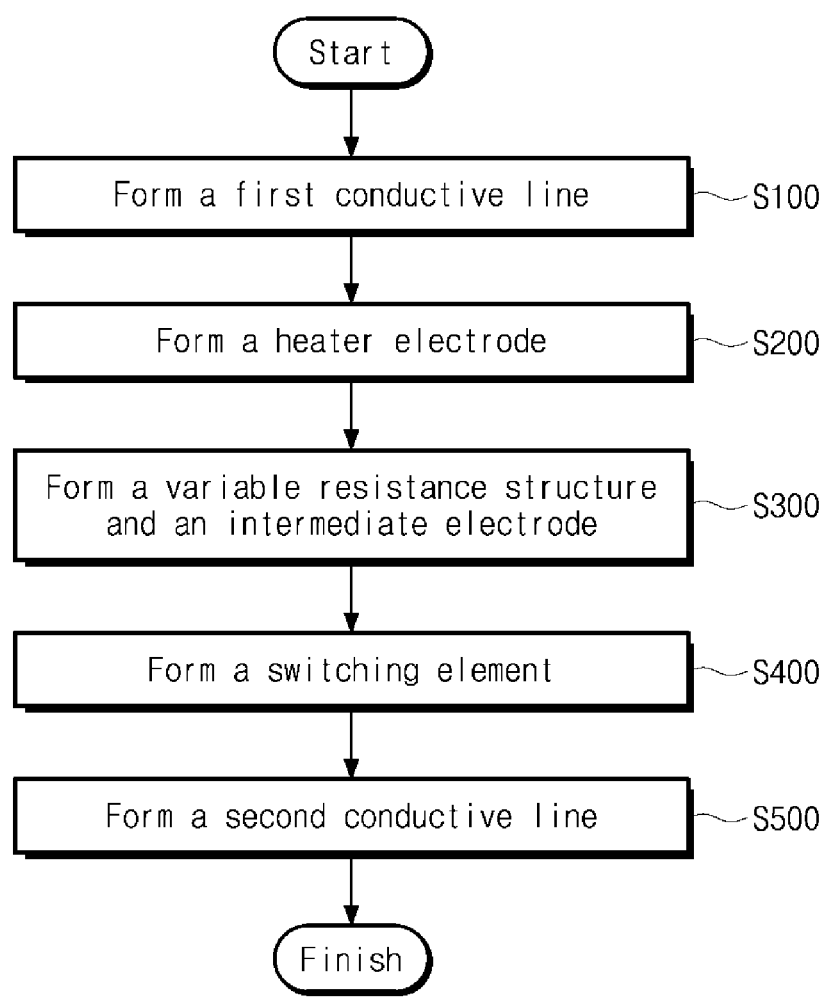
FIG. 6 is a flowchart of an example of a method of manufacturing a variable resistance memory device of FIG. 3, according to the inventive concepts.

FIG. 6 is a flowchart illustrating a method of manufacturing the variable resistance memory device 100 of FIG. 3.

Referring to FIG. 6, a method of manufacturing the variable resistance memory device 100 according the inventive concepts may include forming a first conductive line CL1 (S100), forming a heater electrode HE (S200), forming a variable resistance structure CR and an intermediate electrode ME (S300), forming a switching element SW (S400), and forming a second conductive line CL2 (S500).

FIGS. 7 to 15 are cross-sectional views taken in the direction of lines I-I' and II-II' of FIG. 3 to illustrate an example of the method of manufacturing the variable resistance memory device of FIG. 3.

Figure 7:
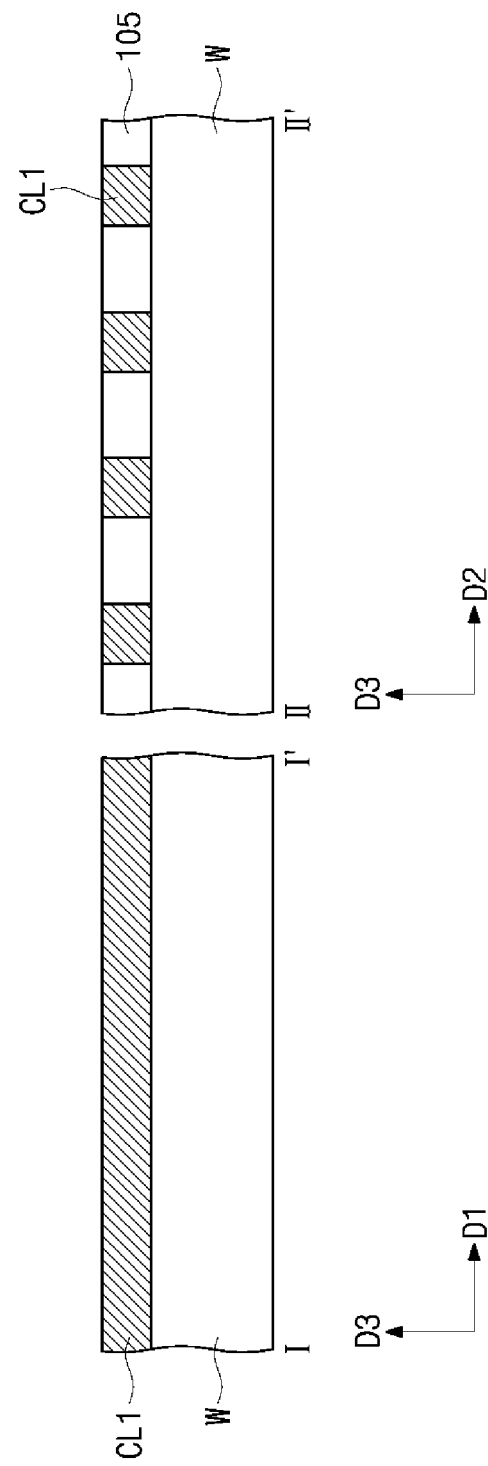
FIGS. 7, 8, 9, 10, 11, 12, 13, 14 and 15 are cross-sectional views of a variable resistance memory device during the course of its manufacture, taken in directions corresponding to the directions of lines I-I' and II-II' of FIG. 3.

Referring to FIGS. 6 and 7, the first conductive line CL1 are formed on a substrate W (S100). In some examples, the first conductive lines CL1 are formed by a deposition process of forming a metal layer, a photolithography process, and an etching process. Thereafter, a lower insulating layer 105 is formed between the first conductive lines CL1. In certain examples, the first conductive lines CL1 are formed by a damascene method. More specifically, the lower insulating layer 105 having lower trenches may be formed on the substrate W, and then, the first conductive lines CL1 may be formed in the lower trenches by a deposition process of forming a blanket metal layer filling the lower trench and a chemical mechanical polishing (CMP) process of planarizing the metal layer.

Figure 8:
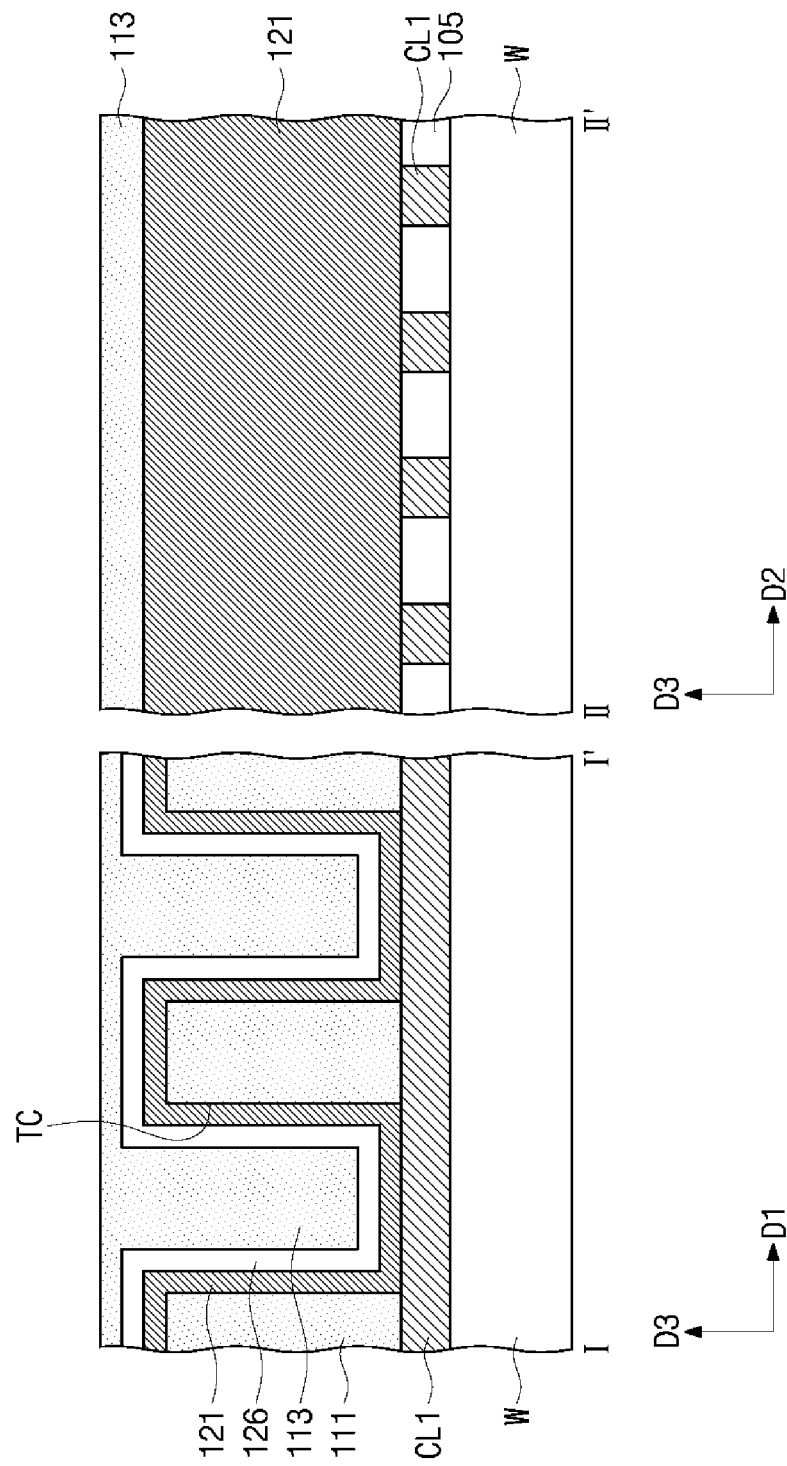
Figure 9:
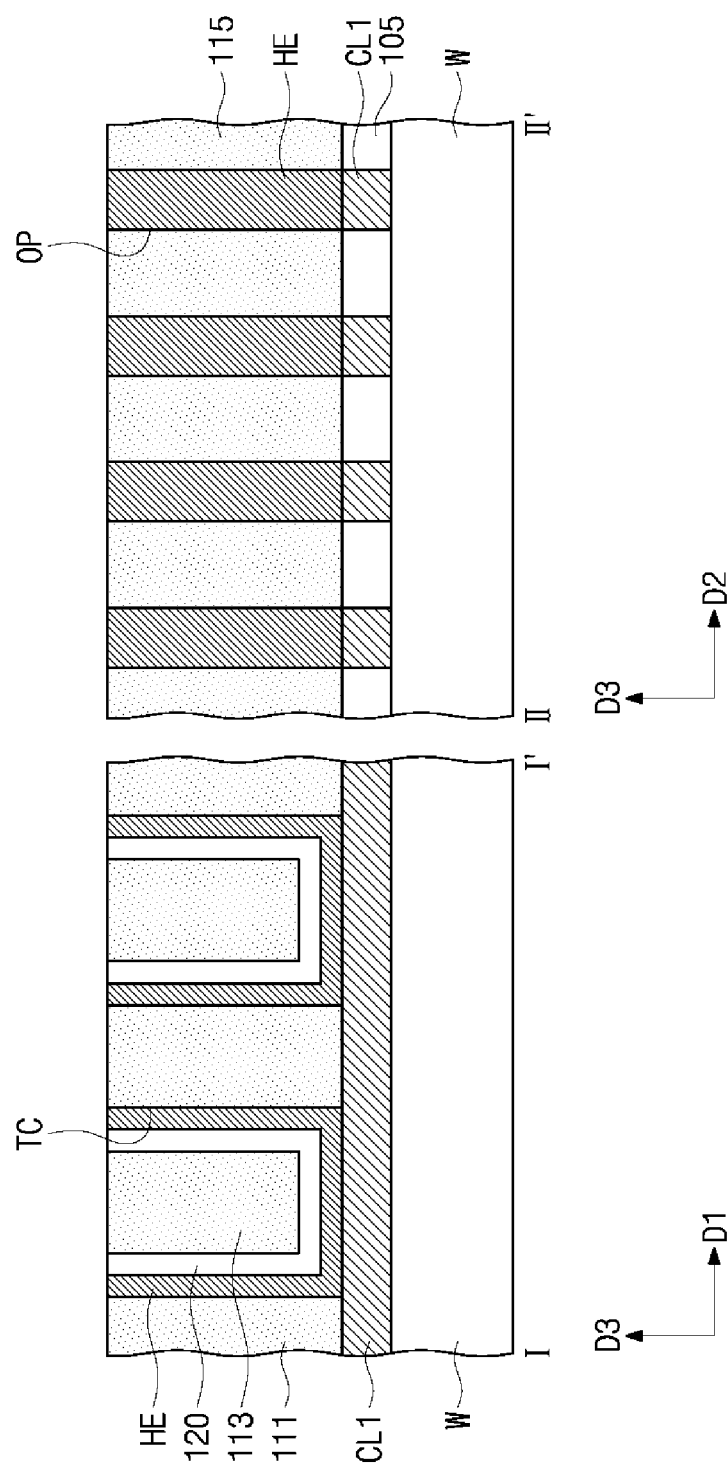

Referring to FIGS. 6, 8 and 9, the heater electrodes HE are formed on the first conductive lines CL1 (S200). In some examples, the forming of the heater electrodes HE includes forming the first to third interlayer insulating layers 111, 113 and 115.

Referring to FIG. 8, an example of forming a heater electrode HE on one of the first conductive lines CL1 will be described. Note, too, in the description that follows, the forming of only one element or feature may be described at times for simplicity although the method may entail the forming of multiple ones of the elements or features at once as will be clear from the figures.

The first interlayer insulating layer 111 may be formed on the first conductive line CL1 and the lower insulating layer 105. The first interlayer insulating layer 111 may be formed of silicon nitride or silicon oxynitride. An upper trench TC may be formed in the first interlayer insulating layer 111. The forming of the upper trench TC may include an anisotropic etching process. The upper trench TC may intersect the first conductive line CL1. Next, an electrode layer 121 and a spacer layer 126 may be sequentially formed on the first interlayer insulating layer 111 having the upper trench TC. The electrode layer 121 and the spacer layer 126 may be conformally formed along surfaces defining the upper trench TC. The electrode layer 121 may include a layer of W, Ti, Al, Cu, C, CN, TiN, TiAlN, TiSiN, TiCN, WN, CoSiN, WSiN, TaN, TaCN, TaSiN, or TiO. The spacer layer 126 may include at least one of silicon oxide and silicon oxynitride. The second interlayer insulating layer 113 may be formed on the spacer layer 126 to fill the remainder of the upper trench TC. The second interlayer insulating layer 113 may be formed of the same material as the first interlayer insulating layer 111.

Referring to FIG. 9, the second interlayer insulating layer 113, the spacer layer 126, and the electrode layer 121 may be planarized until the first interlayer insulating layer 111 is exposed. Subsequently, portions of the first and second interlayer insulating layers 111 and 113, the spacer layer 126 and the electrode layer 121, which do not overlap the first conductive line CL1, may be etched to form an opening OP. As a result, the heater electrode HE may be formed from the electrode layer 121 and a spacer pattern 120 may be formed from the spacer layer 126.

A plurality of the heater electrodes HE may be formed and may be spaced apart from each other in the first direction D1 and the second direction D2. Thereafter, the third interlayer insulating layer 115 may be formed to fill the opening OP. The third interlayer insulating layer 115 may be formed of the same material as the first interlayer insulating layer 111. The forming of the third interlayer insulating layer 115 may include a deposition process of forming a dielectric and a CMP process.

Referring to FIGS. 6 and 10 to 12, the variable resistance structure CR and the intermediate electrode ME may be formed on the heater electrode HE (S300). In some examples, the variable resistance structure CR and the intermediate electrode ME may be formed by a damascene method.

Figure 10:
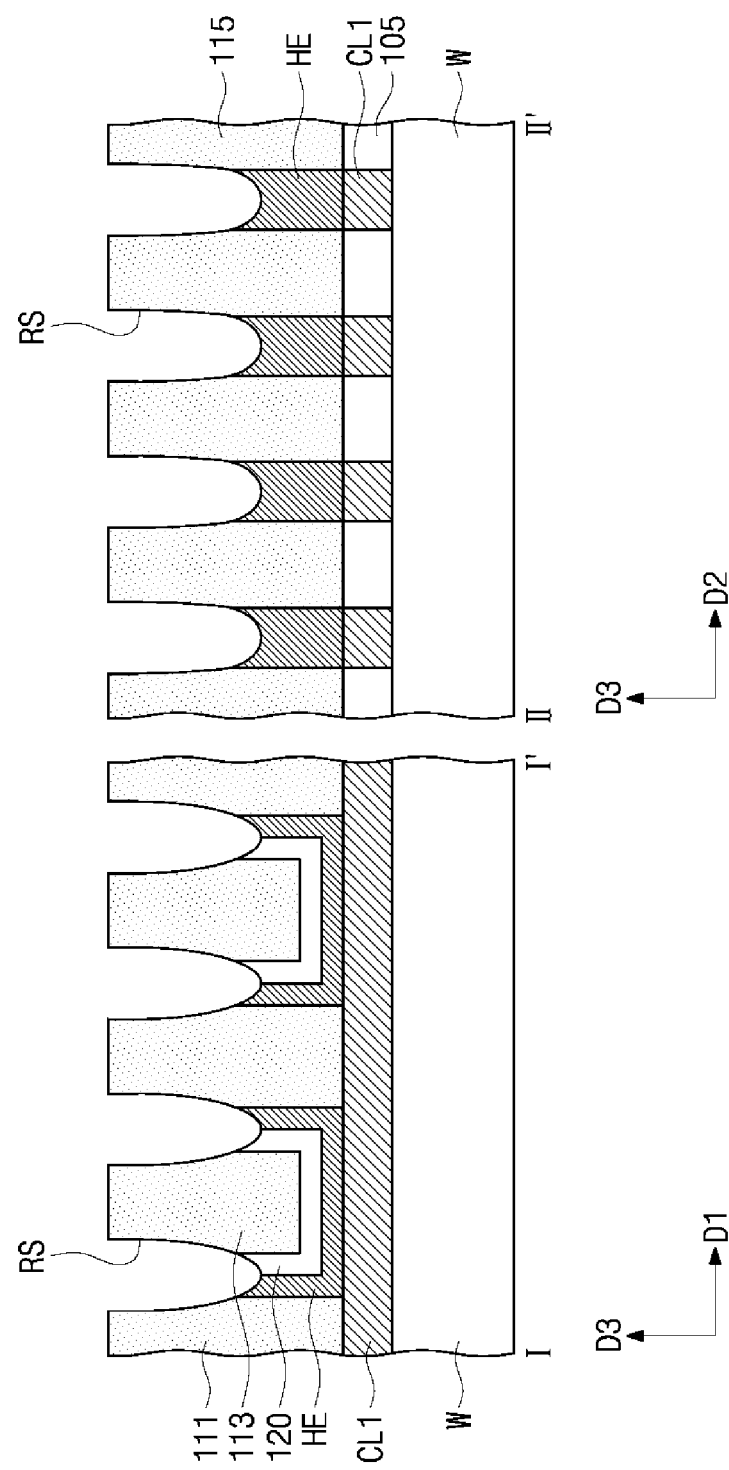

Referring to FIG. 10, a recess RS may be formed to expose the heater electrode HE. The forming of the recess RS may include a process of etching an upper portion of the spacer pattern 120 and a process of etching an upper portion of the heater electrode HE. Each of the processes of etching the spacer pattern 120 and the heater electrode HE may be a wet etching process. Thereafter, an isotropic wet etching process may be performed to expand the space formed by etching the upper portion of the heater electrode HE and the upper portion of the spacer pattern 120. For example, the isotropic wet etching process may be performed using an etchant including phosphoric acid.

Figure 11:
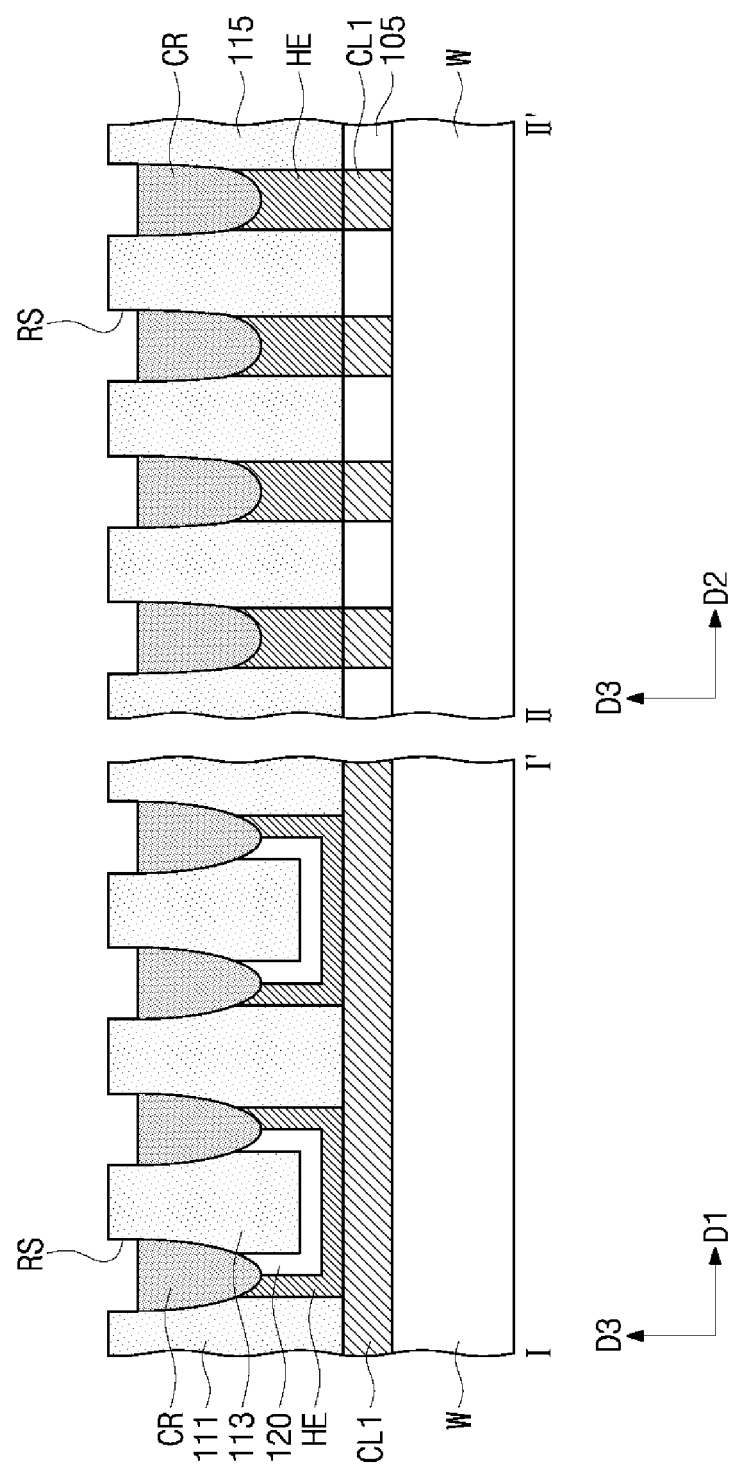

Referring to FIG. 11, the variable resistance structure CR is formed in the recess RS. In some examples, a variable resistance layer is formed to fill the recess RS, and then, an upper portion of the variable resistance layer is etched to form the variable resistance structure CR. The variable resistance layer may be a layer of GeSbTe, GeTeAs, SbTeSe, GeTe, SbTe, SeTeSn, GeTeSe, SbSeBi, GeBiTe, GeTeTi, InSe, GaTeSe, or InSbTe. The variable resistance layer may be formed by a physical vapor deposition (PVD) method or a chemical vapor deposition (CVD) method.

Figure 12:
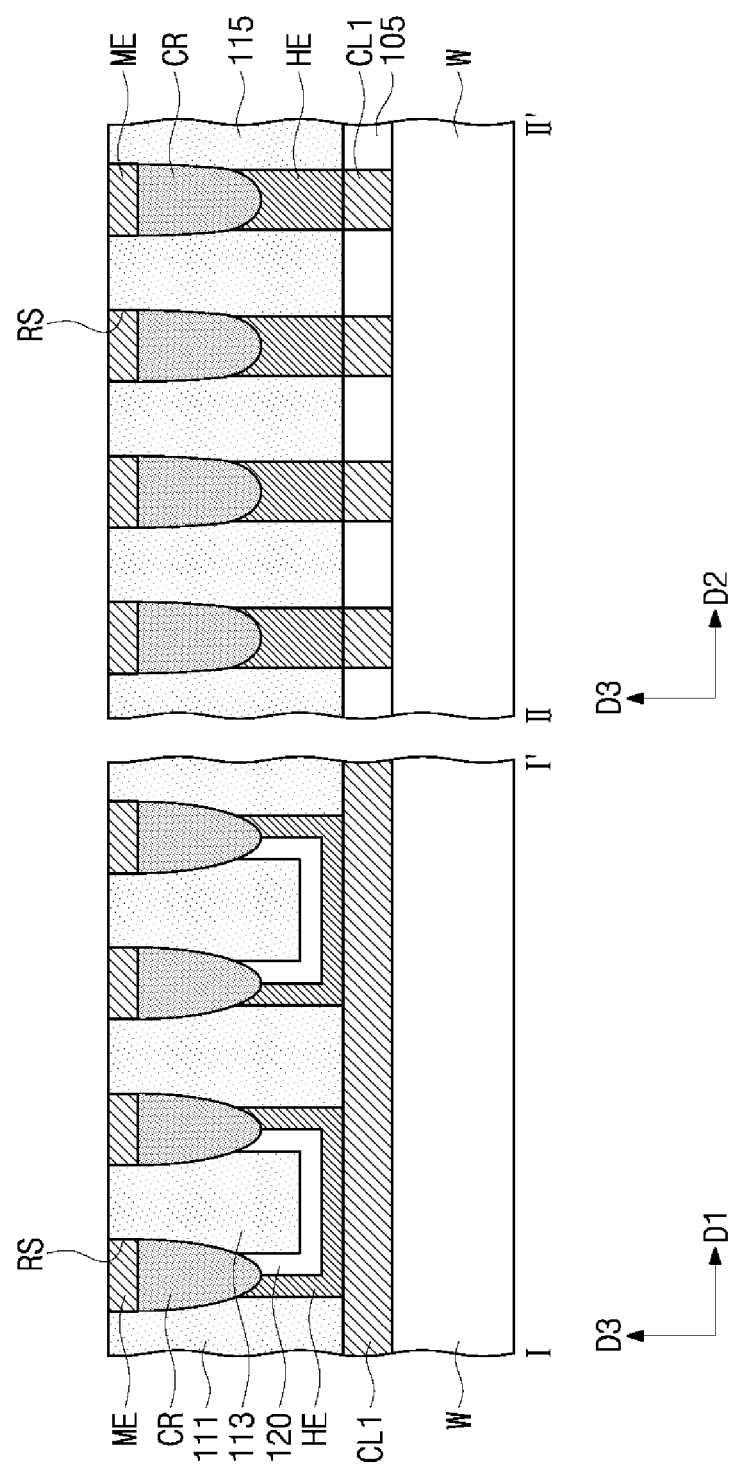

Referring to FIG. 12, an intermediate electrode ME is formed in an upper portion of the recess RS. The intermediate electrode ME may formed of at least one layer of material selected from the group consisting of W, Ti, Al, Cu, C, CN, TiN, TiAlN, TiSiN, TiCN, WN, CoSiN, WSiN, TaN, TaCN, and TaSiN. In some examples, an electrode layer(s) is formed on the resultant structure having the variable resistance structure CR, and then, the electrode layer(s) is planarized to form the intermediate electrode ME. Alternatively, the process of forming the intermediate electrode ME may be omitted.

Figure 13:
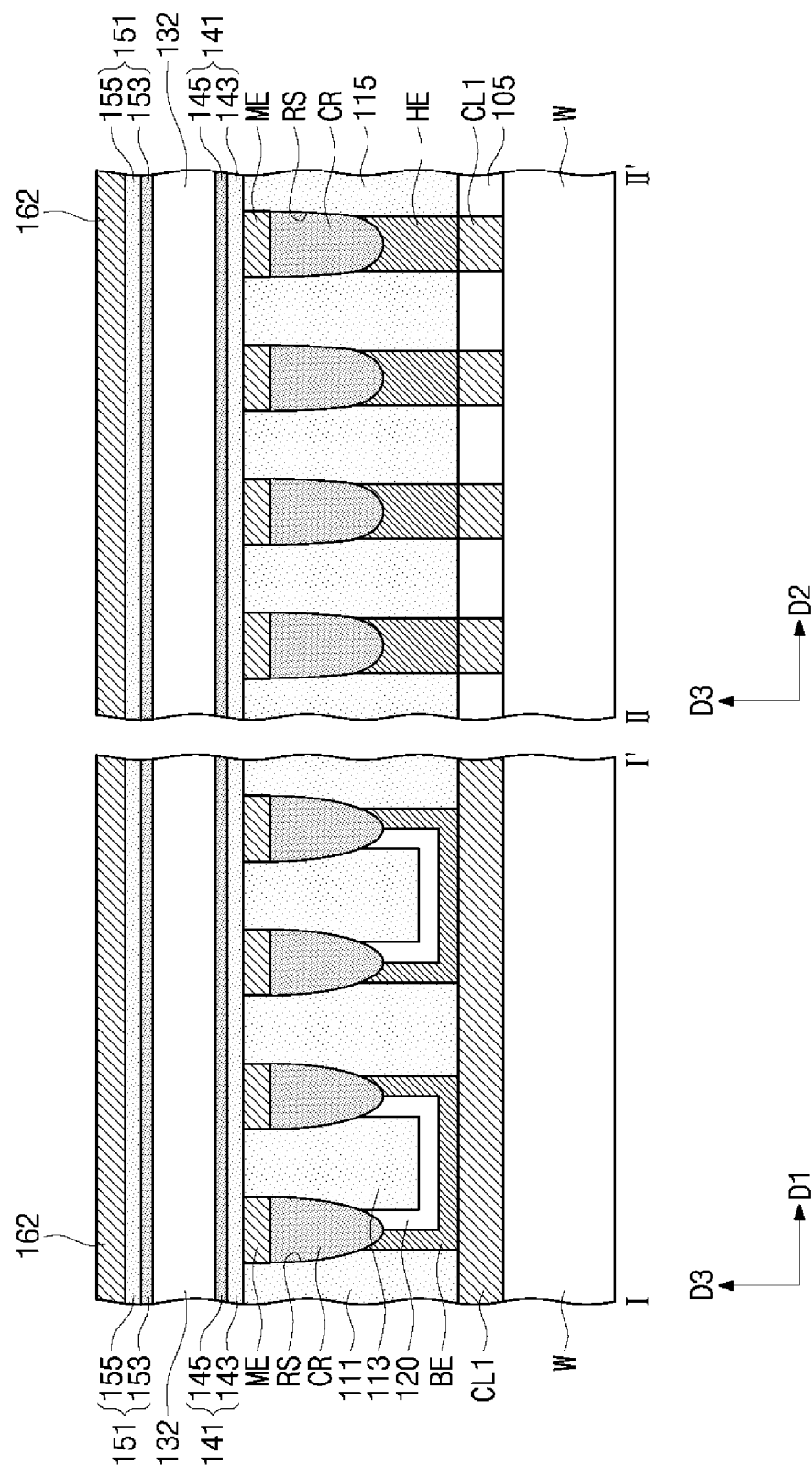
Figure 14:
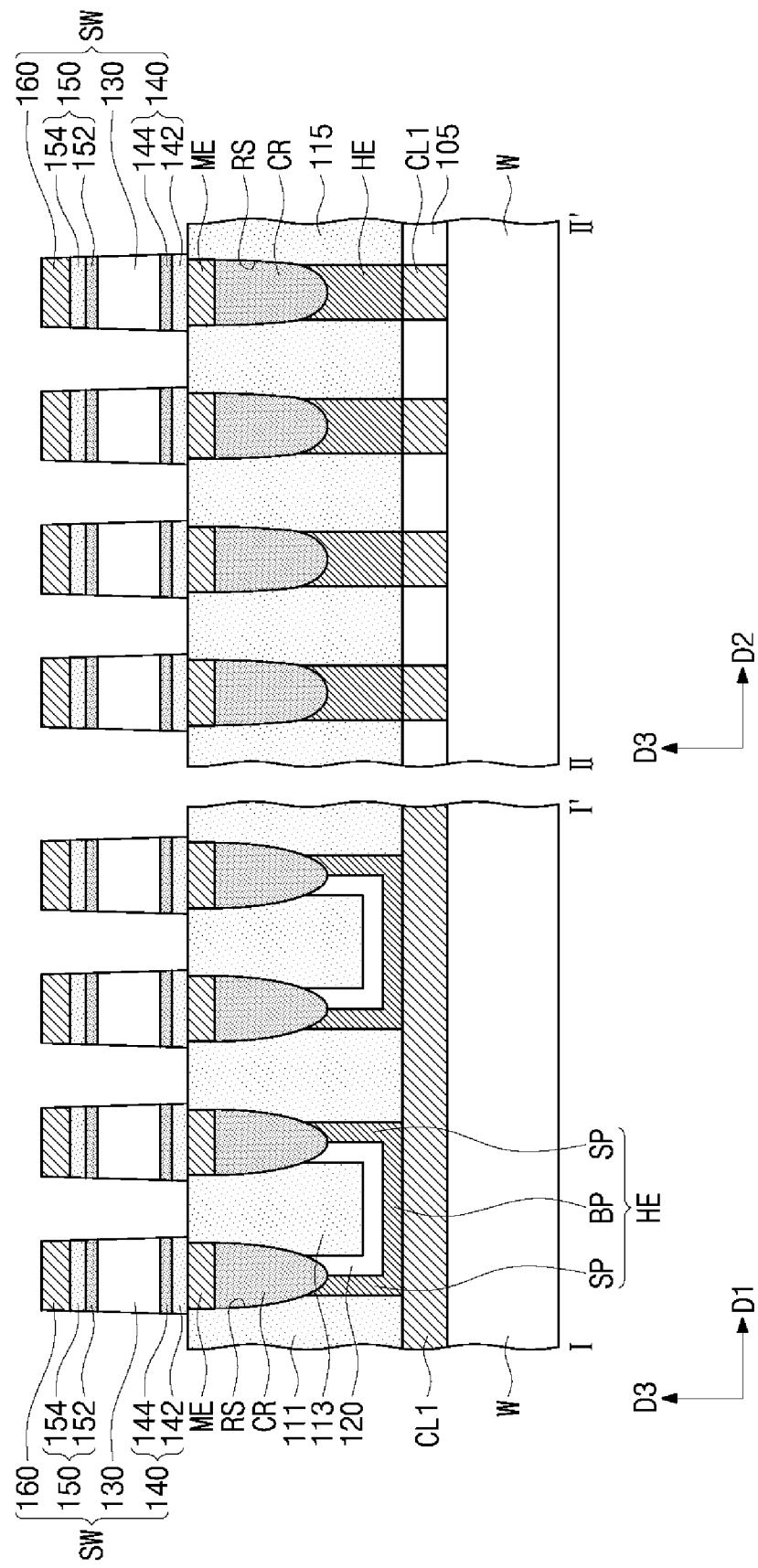

Referring to FIGS. 6, 13 and 14, the switching element SW is formed on the resultant structure, e.g., the structure having the intermediate electrode ME (S400). The switching element SW may be formed by a thin layer deposition process, a photolithography process, and an etching process.

Figure 16:
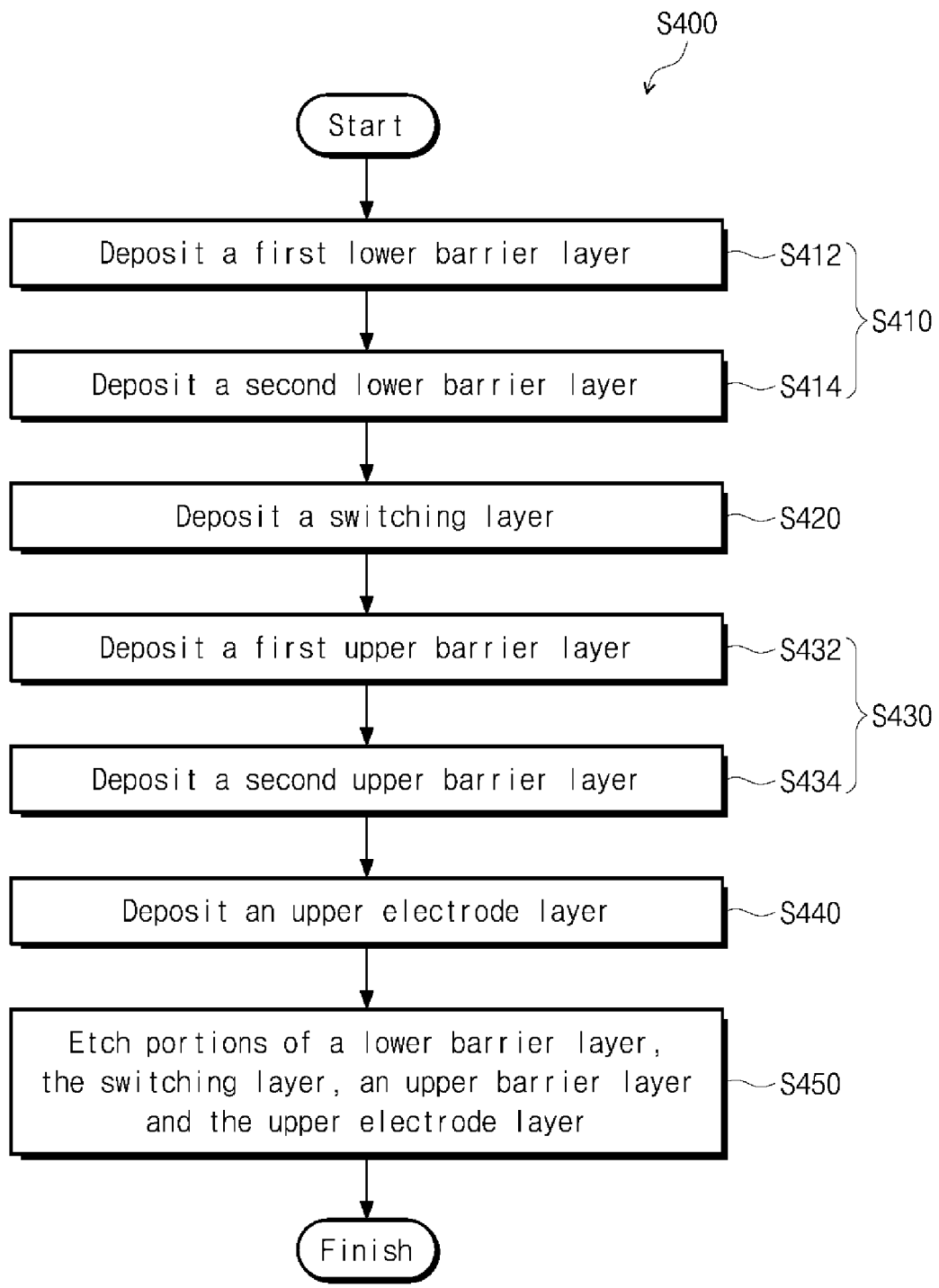
FIG. 16 is a flowchart of an example of an operation of forming a switching element in the method illustrated by the flowchart of FIG. 6.

FIG. 16 is a flowchart illustrating an example of the operation S400 of forming the switching element SW in the method of FIG. 6.

Referring to FIG. 16, an example of the operation S400 of forming the switching element SW includes forming a lower barrier layer 141 (S410), depositing a switching layer 132 (S420), forming an upper barrier layer 151 (S430), depositing an upper electrode layer 162 (S440), and etching portions of the lower barrier layer 141, the switching layer 132, the upper barrier layer 151 and the upper electrode layer 162.

Figure 17:
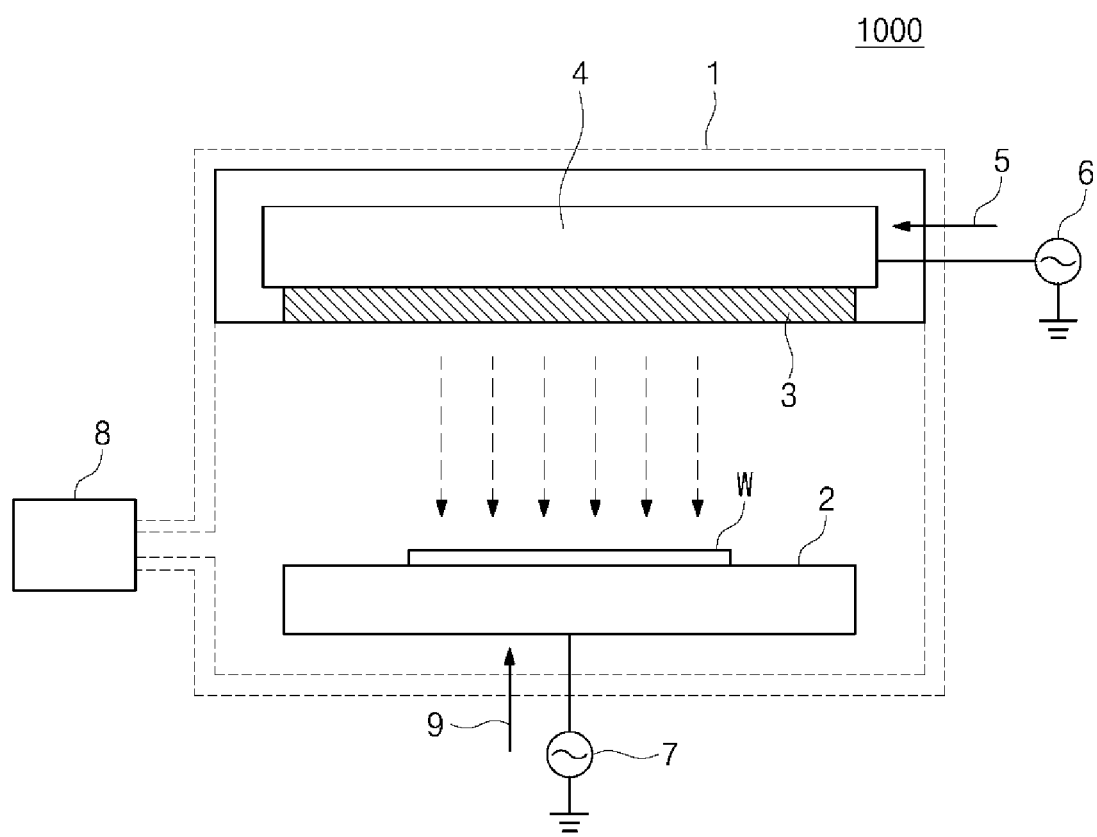
FIG. 17 is a schematic diagram of a thin layer deposition apparatus for forming a lower barrier layer and an upper barrier layer in the stage of the method shown in FIG. 13.

FIG. 17 illustrates a thin layer deposition apparatus 1000 for forming the lower barrier layer 141 and the upper barrier layer 151 of FIG. 13.

Referring to FIG. 17, the thin layer deposition apparatus 1000 is a sputtering apparatus. For example, the thin layer deposition apparatus 1000 may include a chamber 1, a heater chuck 2, a target 3, a magnetron 4, first and second power supply units 6 and 7, and a gas supply unit 8. The gas supply unit 8 provides a process gas into the chamber 1. The process gas may include argon (Ar), nitrogen ($N_2$), or krypton (Kr). The heater chuck 2 may be disposed in a lower portion of the chamber 1, and the magnetron 4 may be disposed in an upper portion of the chamber 1. The substrate W may be provided on the heater chuck 2. The target 3 may be fixed on a bottom surface of the magnetron 4. The target 3 may include a carbon target, a compound target, or a metal target. The compound target may include a compound that includes at least one of Te and Se (i.e., one or more chalcogenide elements) and at least one material selected from the group consisting of Ge, Sb, Bi, Al, Pb, Sn, Ag, As, S, Si, In, Ti, Ga, and P. The metal target may include titanium or titanium nitride. The first power supply unit 6 may provide first radio-frequency power 5 (e.g., source power) to the magnetron 4. The first radio-frequency power 5 excites the process gas to induce plasma in the chamber 1. The first radio-frequency power 5 may accelerate the plasma toward the target 3 to generate target particles. The target particles may be deposited as a thin layer on the substrate W. The second power supply unit 7 may provide second radio-frequency power 9 (e.g., bias power) to the heater chuck 2. The second radio-frequency power 9 may accelerate the target particles and the plasma toward the substrate W to increase the density of the thin layer.

Referring to FIGS. 13, 16 and 17, the thin layer deposition apparatus 1000 may form the lower barrier layer 141 by using the target 3 which is the carbon target (S410). The lower barrier layer 141 may be formed by a sputtering method. In some examples, the lower barrier layer 141 is formed by forming a first lower barrier layer 143 (S412) and forming a second lower barrier layer 145 (S414).

For example, the first power supply unit 6 may supply the first radio-frequency power 5 to the magnetron 4 to form the first lower barrier layer 143 on the substrate W (S412). The heater chuck 2 may heat the substrate W to a high temperature of about 350 degrees Celsius. The gas supply unit 8 may provide the argon gas as the process gas over the substrate W. The first lower barrier layer 143 may include low-density carbon.

Next, the first and second power supply units 6 and 7 may supply the first and second radio-frequency powers 5 and 9 to the magnetron 4 and the heater chuck 2, respectively, to form the second lower barrier layer 145 on the substrate W (S414). The heater chuck 2 may heat the substrate W to a low temperature of about 150 degrees Celsius. The gas supply unit 8 may provide the nitrogen gas or the krypton gas as the process gas over the substrate W. The second lower barrier layer 145 is formed on the first lower barrier layer 143. The second lower barrier layer 145 may include high-density carbon. In an example, the second lower barrier layer 145 includes high-density carbon doped with nitrogen (N).

Next, the switching layer 132 may be formed by a sputtering method (S420). The switching layer 132 may be formed of a compound that includes at least one of Te or Se (i.e., one or more chalcogenide elements) and at least one material selected from the group consisting of Ge, Sb, Bi, Al, Pb, Sn, Ag, As, S, Si, In, Ti, Ga, and P. The switching layer 132 may further include a thermal stabilization element in addition to the compound. The thermal stabilization element may include at least one of C, N, or O. For example, the switching layer 132 may be a layer (pattern) of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe.

Thereafter, the thin layer deposition apparatus 1000 may form the upper barrier layer 151 by using the target 3 which is the carbon target (S430). The upper barrier layer 151 may be formed by a sputtering method. In some examples, the upper barrier layer 151 is formed by forming a first upper barrier layer 153 (S432) and forming a second upper barrier layer 155 (S434).

Referring to FIGS. 13, 16 and 17, the first and second power supply units 6 and 7 may supply the first and second radio-frequency powers 5 and 9 to the magnetron 4 and the heater chuck 2, respectively, to form the first upper barrier layer 153 on the substrate W (S432). The heater chuck 2 may heat the substrate W to a low temperature of about 150 degrees Celsius. The gas supply unit 8 may provide the nitrogen gas or the krypton gas as the process gas over the substrate W. The first upper barrier layer 153 may include high-density carbon. In an example, the first upper barrier layer 153 includes high-density carbon doped with nitrogen (N).

Next, the first power supply unit 6 may supply the first radio-frequency power 5 to the magnetron 4 to form the second upper barrier layer 155 on the substrate W (S434). The heater chuck 2 may heat the substrate W to a high temperature of about 350 degrees Celsius. The gas supply unit 8 may provide the argon gas as the process gas over the substrate W. The second upper barrier layer 155 may include low-density carbon.

Next, the upper electrode layer 162 may be formed by a sputtering method (S440). The upper electrode layer 162 may include at least one material selected from the group consisting of W, Ti, Al, Cu, C, CN, TiN, TiAlN, TiSiN, TiCN, WN, CoSiN, WSiN, TaN, TaCN, TaSiN, and TiO.

Referring to FIGS. 14 and 16, an etching apparatus (not shown) may etch the portions of the lower barrier layer 141, the switching layer 132, the upper barrier layer 151 and the upper electrode layer 162 to form the switching element SW (S450). For example, the portions of the lower barrier layer 141, the switching layer 132, the upper barrier layer 151 and the upper electrode layer 162 may be etched by a reactive ion etching (RIE) method. The switching element SW may include a lower barrier electrode 140, a switching pattern 130, an upper barrier electrode 150, and an upper electrode 160. The upper barrier electrode 150 may include first and second upper barrier electrodes 152 and 154, and the first and second upper barrier electrodes 152 and 154 may be formed from the first and second upper barrier layers 153 and 155, respectively. The lower barrier electrode 140 may include first and second lower barrier electrodes 142 and 144, and the first and second lower barrier electrodes 142 and 144 may be formed from the first and second lower barrier layers 143 and 145, respectively. The first lower barrier layer 143 may increase adhesive strength of the switching element SW with respect to the intermediate electrode ME and/or the first to third interlayer insulating layers 111, 113 and 115. In addition, the first lower barrier layer 143 may minimize or prevent a leaning phenomenon and/or a detachment phenomenon of the switching element SW during the etching process for forming the switching element SW.

Figure 18:
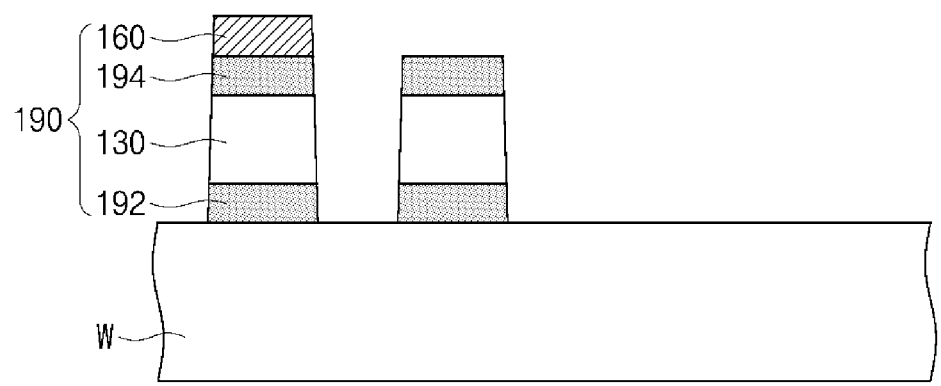
FIG. 18 is a cross-sectional view of a conventional switching element.

FIG. 18 illustrates examples of a conventional switching element 190 formed using an etching process.

Referring to FIG. 18, a typical switching element 190 includes a first barrier electrode 192 and a second barrier electrode 194.

The first barrier electrode 192 is interposed between a substrate W and a switching pattern 130. The first barrier electrode 192 includes high-density carbon. The first barrier electrode 192 reduces or weakens adhesive strength between the substrate W and the switching pattern 130 in an etching process, and thus the conventional switching element 190 may lean and/or be detached. The conventional switching element 190 may even separate from the substrate W.

The second barrier electrode 194 is interposed between the switching pattern 130 and an upper electrode 160. The second barrier electrode 194 includes high-density carbon. The second barrier electrode 194 reduces adhesive strength between the switching pattern 130 and the upper electrode 160 in an etching process to cause detachment of the upper electrode 160. The upper electrode 160 may separate from the second barrier electrode 194.

Referring again to FIG. 14, in contrast to the conventional switching element described above, the upper barrier electrode 150 of a switching element according to the present inventive concepts includes the first and second upper barrier electrodes 152 and 154 formed from the first and second upper barrier layers 153 and 155, respectively. The second upper barrier electrode 154 provides a high degree of adhesive strength between the first upper barrier electrode 152 and the upper electrode 160 during the etching process of forming the first and second upper barrier layers 153 and 155. Thus, detachment of the upper electrode 160 may be minimized or prevented. The upper electrode 160 may be formed from the upper electrode layer 162 through the etching process.

Figure 15:
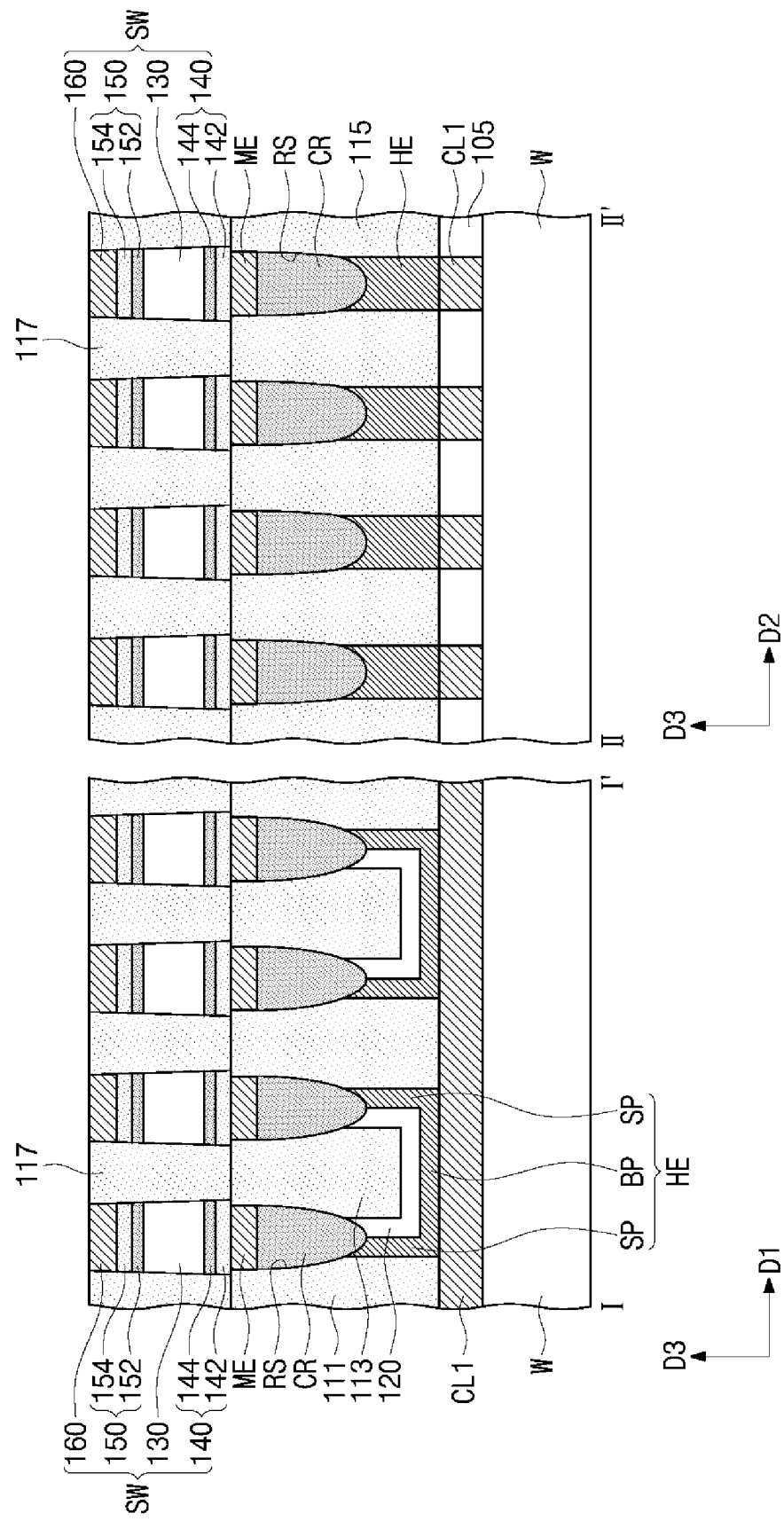

Referring to FIG. 15, a fourth interlayer insulating layer 117 may be formed between the switching elements SW. The fourth interlayer insulating layer 117 may be formed by a deposition process of a dielectric and a CMP process performed on the deposited dielectric.

Referring again to FIGS. 4 and 6, the second conductive line CL2 may be formed on a portion of the fourth interlayer insulating layer 117 and the switching element SW (S500). The second conductive line CL2 may be formed by a deposition process of forming a metal layer, a photolithography process, and an etching process.

Thereafter, an upper insulating layer 119 may be formed between the second conductive lines CL2. The upper insulating layer 119 may be formed by a process of deposition a dielectric and a CMP process performed on the deposited dielectric.

The switching element according to the inventive concepts may minimize or prevent diffusion of constituent elements by the barrier electrode. In addition, the method of manufacturing the switching element according to the inventive concepts may increase the adhesive strength of the barrier electrode to minimize or prevent the leaning phenomenon and/or detachment of the switching element.

Although the inventive concepts have been described with reference to various examples thereof, it will be apparent to those skilled in the art that various changes and modifications may be made to the examples without departing from the spirit and scope of the inventive concepts. Therefore, it should be understood that the above examples are not limiting, but illustrative. Thus, the scope of the inventive concepts are to be determined by the broadest permissible interpretation of the following claims and shall not be restricted or limited by the foregoing description.

What is claimed is:

1. A switching element comprising:
a lower barrier electrode on a substrate;
a switching pattern on the lower barrier electrode; and
an upper barrier electrode on the switching pattern,
wherein the lower barrier electrode comprises:
a first lower barrier electrode layer; and
a second lower barrier electrode layer interposed between the first lower barrier electrode layer and the switching pattern, the second lower barrier electrode layer having a density different from that of the first lower barrier electrode layer,
wherein the first lower barrier layer includes carbon and the second lower barrier layer includes carbon.

2. The switching element of claim 1, wherein the density of the second lower barrier electrode layer is higher than the density of the first lower barrier electrode layer.

3. The switching element of claim 2, wherein the density of the first lower barrier electrode layer is about 1.7 g/cm$^3$, and the density of the second lower barrier electrode layer is about 2.3 g/cm$^3$.

4. The switching element of claim 1, wherein resistivity of the second lower barrier electrode layer is less than that of the first lower barrier electrode layer.

5. The switching element of claim 1, wherein surface roughness of the second lower barrier electrode layer is less than that of the first lower barrier electrode layer.

6. The switching element of claim 1, wherein the upper barrier electrode comprises:
a first upper barrier electrode layer; and
a second upper barrier electrode layer which is disposed on the first upper barrier electrode layer and has a density different from that of the first upper barrier electrode layer.

7. The switching element of claim 6, further comprising:
an upper electrode on the upper barrier electrode,
wherein the density of the second upper barrier electrode layer is lower than that of the first upper barrier electrode layer.

8. The switching element of claim 6, wherein the density of the second upper barrier electrode layer is higher than the density of the first upper barrier electrode layer.

9. The switching element of claim 1, wherein the switching pattern includes a chalcogenide element.

10. A variable resistance memory device comprising:
a first conductive line extending longitudinally in a first direction;
a second conductive line extending longitudinally in a second direction intersecting the first direction when the first conductive line and the second conductive line are viewed in a plan view;
a variable resistance structure interposed between the first and second conductive lines; and
a switching element interposed between the variable resistance structure and the second conductive line,
wherein the switching element comprises:
a lower barrier electrode;
a switching pattern on the lower barrier electrode; and
an upper barrier electrode on the switching pattern, and
wherein the lower barrier electrode comprises:
a first lower barrier electrode layer; and
a second lower barrier electrode layer interposed between the first lower barrier electrode layer and the switching pattern, the second lower barrier electrode layer having a density different from that of the first lower barrier electrode layer.

11. The variable resistance memory device of claim 10, further comprising:
an intermediate electrode interposed between the first lower barrier electrode layer and the variable resistance structure.

12. The variable resistance memory device of claim 11, wherein a width of the first lower barrier electrode layer is greater than a width of the intermediate electrode.

13. The variable resistance memory device of claim 10, wherein the upper barrier electrode comprises:
a first upper barrier electrode layer; and
a second upper barrier electrode layer which is interposed between the first upper barrier electrode layer and the second conductive line and has a density different from that of the first upper barrier electrode layer.

14. The variable resistance memory device of claim 10, wherein the switching element further comprises an upper electrode interposed between the upper barrier electrode and the second conductive line.

15. A variable resistance memory device comprising:
a first conductive line;
a second conductive line; and a memory cell interposed between and electrically connected to the first and second conductive lines, the memory cell including a variable resistor whose resistivity is temperature dependent and a switch interposed between the variable resistor and the second conductive line, wherein the switch comprises:

a switching pattern that selectively electrically conductively connects the variable resistor to the second conductive line, a first lower layer of barrier material interposed between the variable resistor and the switching pattern, and a second lower layer of barrier material interposed between the first lower layer of barrier material and the switching pattern, the barrier material of the second lower layer having a density different from that of the barrier material of the first lower layer.

16. The variable resistance memory device of claim 15, wherein the density of the barrier material of the second lower layer of the switch is higher than the density of the barrier material of the first lower layer of the switch.

17. The variable resistance memory device of claim 16, wherein the first lower layer of the switch is a carbon film and the second lower layer of the switch is a carbon film.

18. The variable resistance memory device of claim 15, wherein the switching pattern is of a compound that includes a chalcogenide element.

19. The variable resistance memory device of claim 15, wherein the variable resistor comprises a pattern of phase change material having a phase transition temperature across which a state of the phase change material changes between a crystalline state and an amorphous state, and further comprising:

a heating electrode interposed between the variable resistor and the first conductive line.

* * * * *